(12) United States Patent
Kamiyama

(10) Patent No.: US 7,596,048 B2
(45) Date of Patent: Sep. 29, 2009

(54) MEMORY SYSTEM AND METHOD OF CONTROLLING THE SAME

(75) Inventor: Yohei Kamiyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 12/038,349

(22) Filed: Feb. 27, 2008

(65) Prior Publication Data

US 2008/0219078 A1      Sep. 11, 2008

(30) Foreign Application Priority Data

Feb. 28, 2007   (JP) ............... 2007-050435

(51) Int. Cl.
G11C 5/14    (2006.01)
(52) U.S. Cl. .................... 365/226; 365/227
(58) Field of Classification Search ........... 365/226, 365/227, 189.04
See application file for complete search history.

(56) References Cited

U.S. PATENT DOCUMENTS 5,469,399 A * 11/1995 Sato et al. ............... 365/226
6,982,919 B2 * 1/2006 Kumahara et al. .......... 365/226
7,483,329 B2 * 1/2009 Luo et al. ................. 365/226
2007/0263469 A1 * 11/2007 Cornwell et al. ........... 365/226

FOREIGN PATENT DOCUMENTS

JP        2002-300444        10/2002

* cited by examiner

*Primary Examiner*—Anh Phung
(74) *Attorney, Agent, or Firm*—Oblon, Spivak, McClelland, Maier & Neustadt, L.L.P.

(57) ABSTRACT

One aspect in accordance with the present invention provides a memory system receiving a power supply from a host device. The memory system includes a non-volatile semiconductor memory and a controller for controlling writing and reading data to and from the semiconductor memory. The controller operates in such a manner that an amount of each of n currents is deducted from an amount of a current supplied from the power supply, the n currents having n values that gradually increase from the first to n-th.

20 Claims, 11 Drawing Sheets

MEMORY SYSTEM AND METHOD OF CONTROLLING THE SAME

CROSS-REFERENCE TO RELATED APPLICATIONS

This application is based upon and claims the benefit of priority from prior Japanese Patent Application No. 2007-050435, filed Feb. 28, 2007, the entire contents of which are incorporated herein by reference.

FIELD OF THE INVENTION

The present invention relates to memory systems and, in particular, to a memory system including a non-volatile semiconductor memory and a controller controlling the memory.

DESCRIPTION OF THE RELATED ART

Memory cards having a non-volatile semiconductor memory and a controller for controlling this memory are well-known. A memory card is inserted into a host device to store data and output the stored data in response to requests from the host device, and operates by receiving power supply from the host device. The power supplied from the host device is provided to a controller and a memory in the memory card.

There exist host devices having various forms and characteristics in order to provide convenience to users. Specifically, the host devices include, for example, digital cameras, printers, universal serial bus (USB) memories, personal computers (PC), card leaders/writers, and the like. Such host devices in various forms are manufactured by various manufacturers.

There has always been an increasing demand among users for higher-speed performances of memory cards (in writing, reading, and the like). In order to satisfy such a demand for the higher-speed performances, various new techniques have been proposed and practically implemented. However these new techniques generally make the memory cards consume a larger current than that used in normal operations. Note that how much current is consumed depends on a technique used to provide the higher-speed performance. As described above, the current consumption of memory cards has been increasing.

It is required that a host device can apply, to the memory card, a voltage determined by its specifications. However, when the memory card consumes a large current, some host devices cannot supply a specified voltage due to the design of a power supply circuit thereof, or the like. When a supplied voltage falls below the specified value, the memory card may possibly malfunction. To a memory card consuming a certain current, some host devices can supply the specified voltage, but some cannot. In other words, strength of a power source against current consumption of a memory card varies among host devices.

In order to support host devices having a power source of low strength, current consumption of memory cards may be uniformly reduced. However, with this approach, the memory card cannot achieve its possible performances. In addition, this approach prevent the host device having a high-capability of power supply and being capable of making a high-speed access to the memory card from obtaining such possible performances.

SUMMARY

A first aspect in accordance with the present invention provides a memory system receiving a power supply from a host device. The memory system includes: (1) a non-volatile semiconductor memory, and (2) a controller for controlling writing and reading data to and from the semiconductor memory, in response to a request from the host device. The controller operates in such a manner that an amount of each of n currents is deducted from an amount of a current supplied from the power supply, the n currents having n values that gradually increase from the first to n-th (n is a natural number equal to or larger than 2). When an amount of each of the n currents is deducted from an amount of a current supplied from the power supply in order from the first to n-th values, the controller determines whether or not the corresponding voltage of the power supply falls below a preset detection voltage. After detecting that a current having the p-th (p is a natural number between 2 and n, inclusive) one of the n values makes the corresponding voltage of the power supply to fall below the detection voltage, the controller operates so that the memory system consumes a current having a value smaller than the p-th one of the n values.

A second aspect in accordance with the present invention provides a memory system receiving a power supply from a host device. The memory system includes: (1) a non-volatile semiconductor memory, and (2) a controller for controlling writing and reading data to and from the semiconductor memory, in response to a request from the host device. The controller operates in such a manner that an amount of each of n currents is deducted from an amount of a current supplied from the power supply, the n currents having n values that gradually increase from the first to n-th (n is a natural number equal to or larger than 2). When an amount of each of the n currents is deducted from an amount of a current supplied from the power supply in order from the first to n-th values, the controller determines whether or not the corresponding voltage of the power supply falls below a preset detection voltage. After detecting that a current having the p-th (p is a natural number between 2 and n, inclusive) one of the n values makes the corresponding voltage of the power supply to fall below the detection voltage, the controller operates so that the memory system consumes a current having a value obtained by multiplying a value smaller than the p-th one of the n values by a common value larger than 1.

A third aspect in accordance with the present invention provides a method of controlling a memory system including a non-volatile semiconductor memory and a controller for controlling writing and reading data to and from the semiconductor memory in response to request from the host device. The method includes: (1) deducting an amount of each of n currents from an amount of a current supplied from the power supply, the n currents having n values that gradually increase from the first to n-th (n is a natural number equal to or larger than 2), (2) determining whether or not the corresponding voltage of the power supply falls below a preset detection voltage when an amount of each of the n currents is deducted from an amount of a current supplied from the power supply in order from the first to n-th values, and (3) operating so that the memory system consumes a current having a value smaller than the p-th one of the n values after detecting that a current having the p-th (p is a natural number between 2 and n, inclusive) one of the n values makes the corresponding voltage of the power supply to fall below the detection voltage.

DETAILED DESCRIPTION OF THE INVENTION

Figure 1:
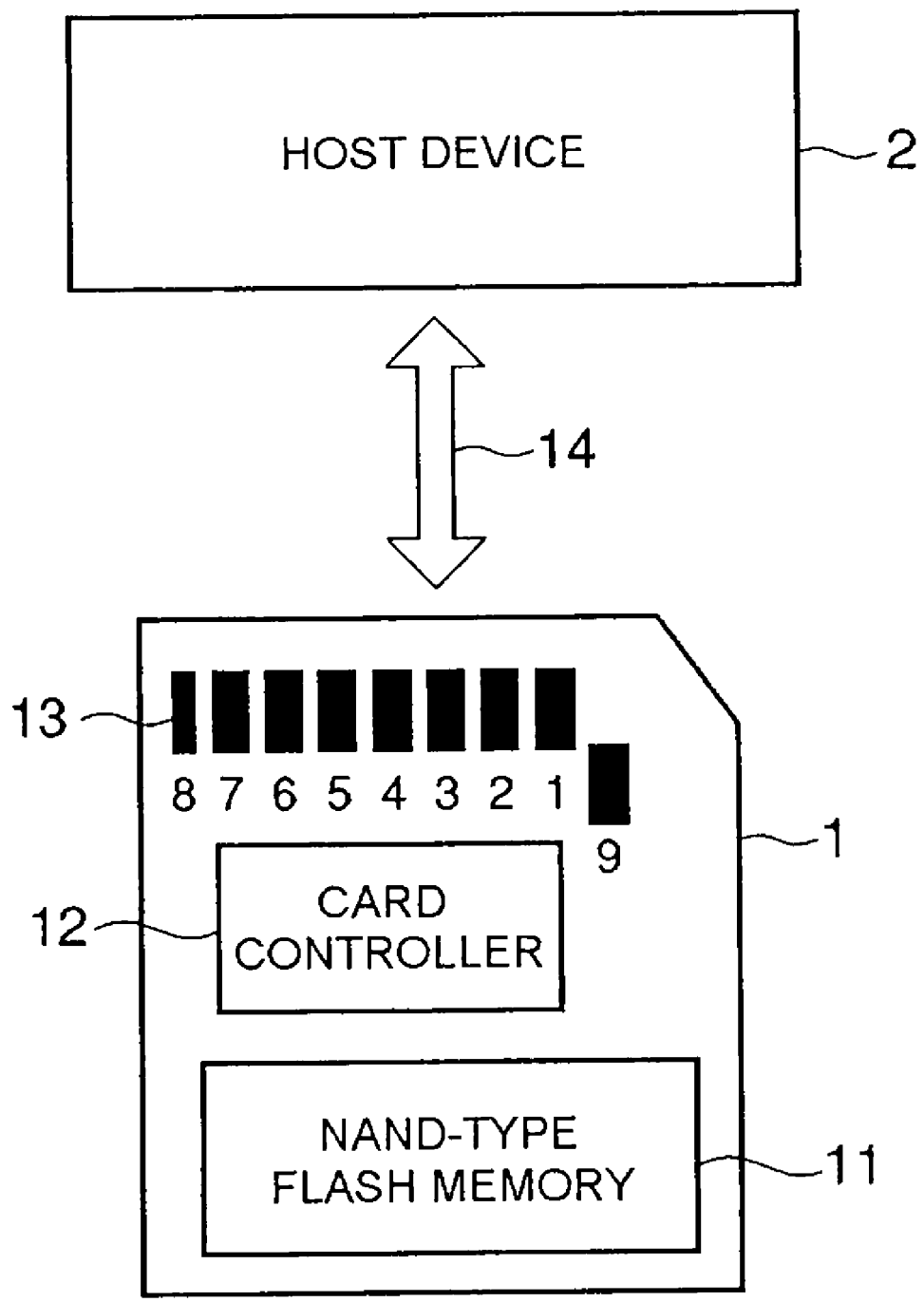
FIG. 1 schematically shows a configuration of a memory card according to a first embodiment of the present invention.

Embodiments of the present invention will be described by referring to the drawings. Note that in the following description, the same reference numerals are given to denote components having substantially the same functions and configurations, and the description thereof will be repeated only when it is needed.

Each embodiment to be described below exemplarily shows an apparatus and a method for embodying a technical idea of the present invention. In the technical idea of the present invention, materials, shapes, structures, arrangements, and the like of components are not limited to those to be described in the following description. The technical idea of the present invention can be variously changed within the scope of claims.

Hereinafter, a description will be given of a memory card as one example of a memory system according to each embodiment of the present invention. However, the memory system according to each embodiment is not limited to a memory system to be exemplarily shown below. Specifically, the memory system according to the embodiment should include a memory (a memory chip) and a controller for controlling this memory, each of which will be described below, but it may have any configurations in the other portions.

First Embodiment

FIG. 1 schematically shows a configuration of a memory card according to a first embodiment of the present invention. Each function block in each embodiment of the present invention can be implemented as any one of hardware and computer software, or a combination of both. Thus, to clearly show that each function block can be implemented as any of these, the function blocks are generally described from the viewpoint of their functions. It depends on a specific mode of implementation of these functions or design constraints of the entire system whether these functions are implemented in hardware or software. Although those skilled in the art can implement these functions with various methods according to each specific mode of implementation, to determine such implementation is included in the scope of the present invention.

As shown in FIG. 1, a memory card 1 include a chip of an NAND-type flash memory (hereinafter referred to simply as a memory) 11, a card controller 12 for controlling the memory 11, and multiple signal pins (first to ninth pins) 13. In addition, the memory card 1 is formed so that it can be removably inserted to a slot provided to a host device 2.

The memory card 1 receives and transmits a signal from/to the host device 2 through an interface 14. The memory card 1 is electrically connected to the host device 2 through the signal pins 13.

The signal pins 13 are electrically connected to the card controller 12. The signal pins 13 include first to ninth pins. For example, data signals 0 to 3, a card detection signal, a command, a grand potential Vss, a power supply potential Vdd, and a clock signal are appropriately allocated to the first to ninth pins.

A power supply circuit 10 of the host device 2 supplies power to the memory card 1 through the signal pins 13. The host device 2 sends, as a serial signal, a command to the card controller 12 through the signal pins 13. The card controller 12 obtains the command and data in response to a clock signal supplied from the signal pins 13.

The memory 11 and the card controller 12 communicate with each other through an interface for an NAND-type flash memory. Specifically, the memory 11 and the card controller 12 are connected through unillustrated 8-bit parallel input/output (I/O) lines. For example, in writing data to the memory 11, the card controller 12 sequentially inputs, to the memory 11, a data input command, column address, page address, the data, and writing (programming) command, through the I/O lines.

Figure 2:
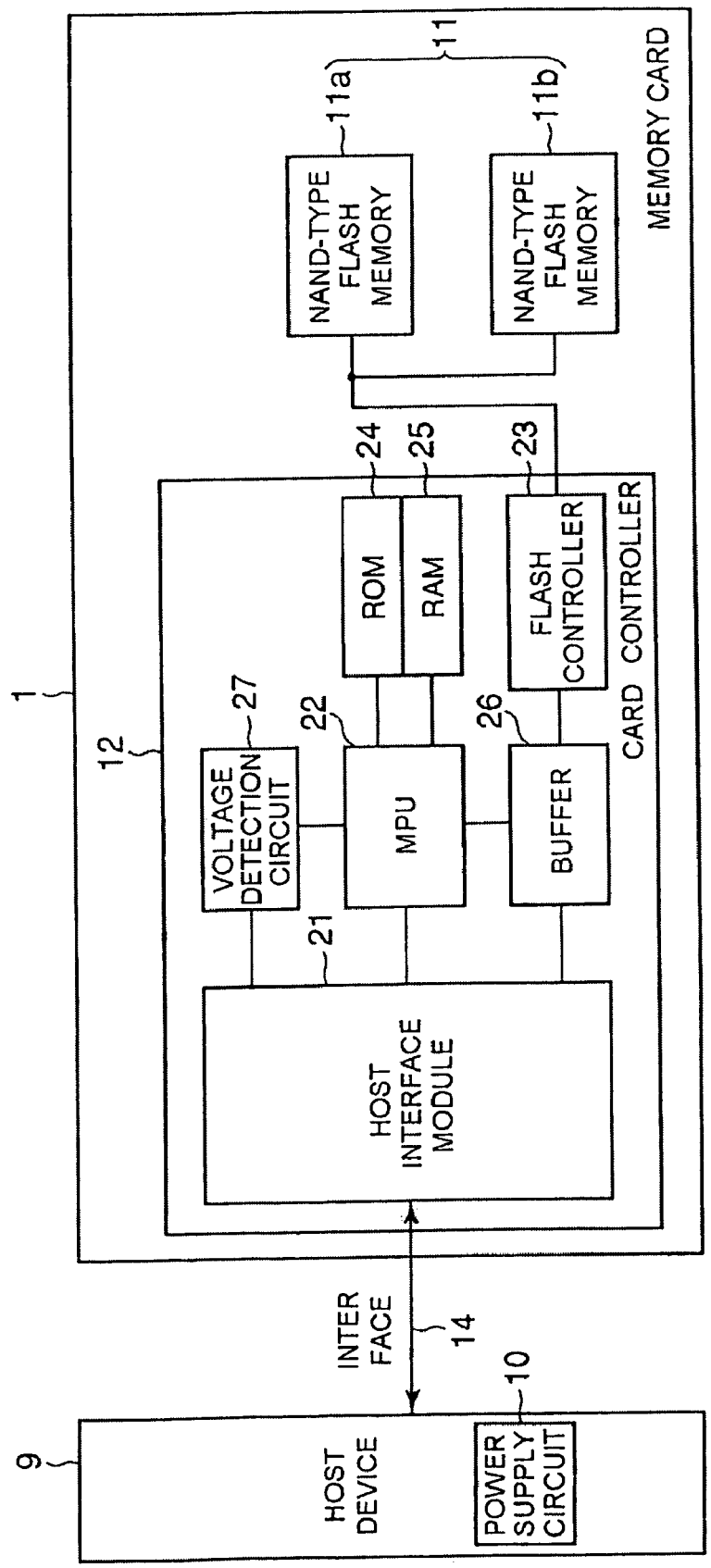
FIG. 2 is a block diagram more specifically showing the configuration of the memory card according to the first embodiment.

FIG. 2 is a block diagram more specifically showing the configuration of the memory card according to the first embodiment. As shown in FIG. 2, the host device 2 includes hardware and software for accessing the memory card 1 through the interface 14.

The memory 11 may have multiple NAND-type flash memories 11 (11a, 11b). In FIG. 2, the number of the NAND-type flash memories is two, as an example. However, it may be one or three or more. Hereinafter, the memories are comprehensively denoted as the memory 11 it is not needed to distinguish between the memories.

The memory 11 stores and reads out data by a unit of storage with a predetermined size (the unit will be referred to as a page). Each page includes multiple memory cell transistors. Each memory cell is formed of a so-called metal oxide semiconductor field effect transistor (MOSFET) with a stacked gate structure. The MOS transistor with the stacked gate structure includes a stacked tunnel insulating film, a floating gate electrode, an interelectrode insulating film, a control gate electrode, and a source/drain diffusion layer. Each memory cell transistor changes a threshold voltage in accordance with the number of electrons stored in the floating gate electrode, and stores information corresponding to the different threshold voltages. Data is written and read to/from each of sets of the multiple memory cell transistors. A storage region formed of the memory cell transistor is set corresponds to one page. In addition, the memory 11 erases data therefrom by a unit of erase (a block) formed of multiple pages.

Figure 3:
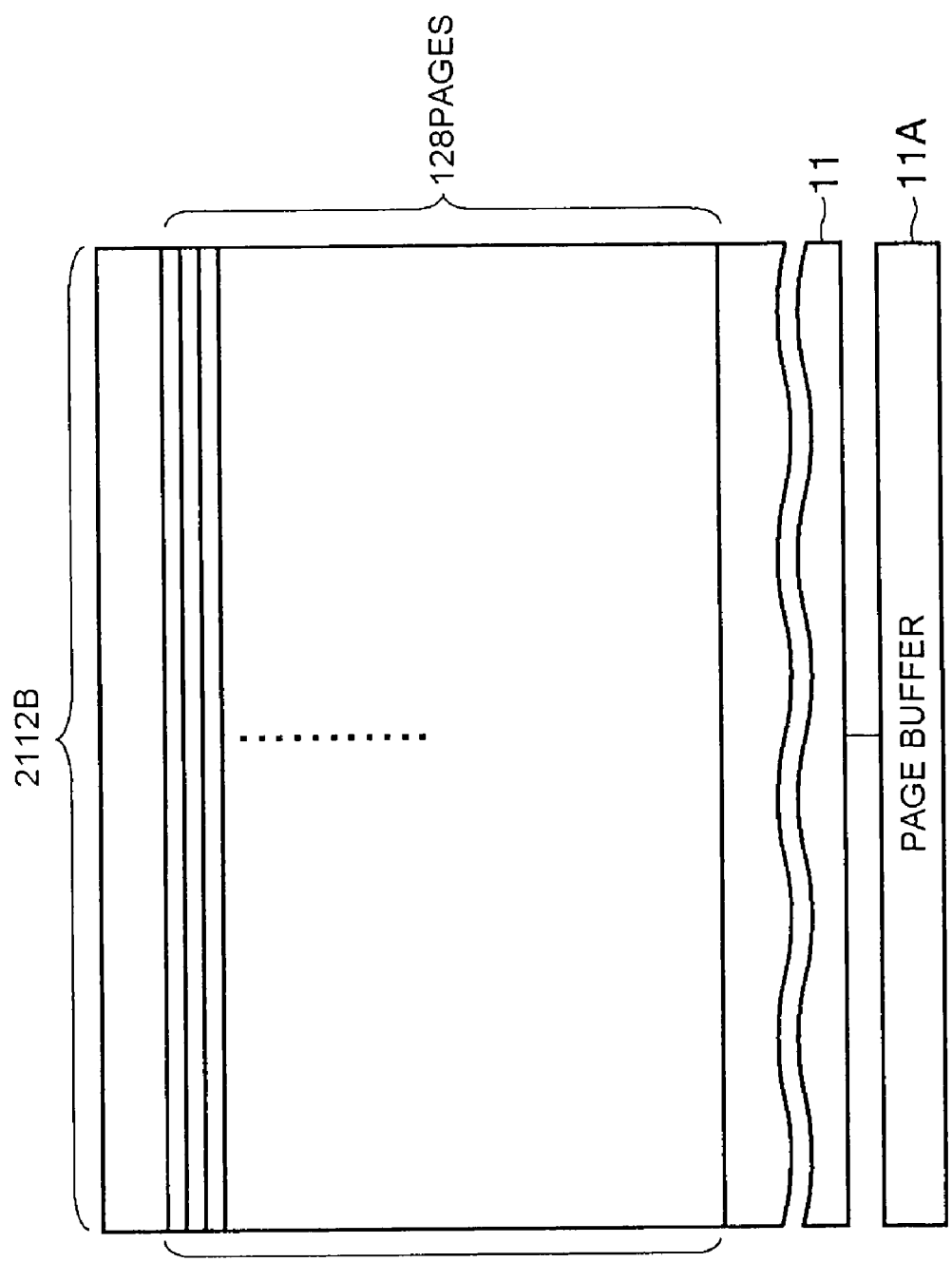
FIG. 3 shows a structure of a storage region of a memory.

FIG. 3 shows a structure of the storage region of the memory 11. Each page of the memory 11 has, for example, 211 2 B (a data storage section for 512 B×4+a redundant section for 10 B×4+a management data storage section for 24 B). For example, one unit of erase (256 kB+8 kB (where k is 1024)) is 128 pages.

In addition, the memory 11 is provided with a page buffer 11A which is used for inputting and outputting data to/from the memory 11. The storage capacity of the page buffer 11A is, for example, 2112 B (2048 B+64 B).

The storage region of the memory 11 may be divided into multiple regions according to kinds of data to be stored. As the data storage region, for example, a management data region, a confidential data region, a protected data region, and a user data region, are defined.

Referring back to FIG. 2, the card controller 12 manages a physical condition inside the memory 11 (for example, it manages what number logical sector address of data is included in which physical block, and which block is in an erase state). In addition, it determines which block the data to be written and independently specified by the logical address is written in (allocated to).

The card controller 12 has, for example, a host interface module 21, a micro processing unit (MPU) 22, a flash controller 23, a read only memory (ROM) 24, a random access memory (RAM) 25, a buffer 26, and a voltage detection circuit 27. Although these elements are provided in the card controller 12, they may be provided separately from the card controller 12.

The host interface module 21 performs interface processing between the card controller 12 and the host device 2. The configuration of hardware of the host interface module 21 includes, as described above, the signal pins 13.

The MPU 22 controls operations of the entire memory card 1. For example, the MPU 22 executes predetermined processing by reading out firmware (a control program), which is stored in the ROM 24, when the memory card 1 receives power supply.

Also, the MPU 22 receives commands of writing, reading, and erasing, from the host device 2, thereby performing predetermined processing on the memory 11 or controlling data transfer through the buffer 26. The MPU 22 (the card controller 12) is configured to access the memory 11 with various access methods (writing, reading) so that a high-speed performance can be achieved in the memory card 1. In addition, the MPU 22 is configured so as to be capable of operating at various system frequencies within an appropriate range.

There are currently various methods with which the card controller 12 (the MPU 22) accesses the memory 11. In addition, it is likely that other methods will be developed in the future. Since it is thus impossible to describe all of the methods herein, some of them will be shown below, as examples. However, the scope of the present invention is not limited to the access methods, but includes the case where access methods to be likely proposed in the future are used.

One access method is, for example, a writing process (a single writing processing) on only one page (a page of one of the memories 11). In the single writing processing, one of the memories 11 writes data in response to an instruction from the card controller 12, at a time. The memory card 1 consumes the least current in the single writing processing, among various access methods.

Another access method is, for example, to simultaneously perform the writing and reading processes (a simultaneous writing/reading processing). In the simultaneous writing/reading processing, one of the memories 11 (11a, 11b) writes data while the other memory reads data. This access method makes it possible to achieve a faster processing speed in the memory card 1. However, the memory card 1 consumes a larger current in the simultaneous writing/reading processing than in accessing only one of the memories at a time.

Still another access method is to simultaneously perform multiple writing processes (a simultaneous writing processing) In the simultaneous writing processing, the memories 11a and 11b simultaneously write data in response to an instruction from the card controller 12. This access method also makes it possible to achieve a faster processing speed in the memory card 1. However, since the memory card 1 consumes a larger current in writing data than in reading data, it consumes a larger current in the simultaneous writing processing than in the simultaneous reading/writing processing.

In addition to the foregoing methods, there are an access method of reading data simultaneously from the two memories 11a and 11b, and an access method that the controller 12 prepares for the next writing process while a writing process is performed in the memory 11. While the controller 11 is processing a read data, the memory can be made to read a data therefrom. Furthermore, the access methods include to erase data, and to perform a so-called multi-page copy. The multi-page copy means an operation of copying data that is stored on multiple pages onto multiple different pages as a single command sequence.

The ROM 24 stores programs for causing the MPU 22 to execute various kinds of processing, including the above-described various accesses. The RAM 25 is used as a working area of the MPU 22 and stores programs and various kinds of tables on the ROM 24.

The flash controller 23 performs interface processing between the card controller 12 and the memory 11.

The buffer 26 temporarily stores a certain amount of data (for example, for one page) among data transmitted from the host device 2 or the memory 11.

The voltage detection circuit 27 detects voltage supply capability of the host device 2 according the procedure to be described below. The voltage detection circuit 27 includes at least a comparator circuit. Voltage detection circuits 27B and 27C will be respectively described in second and third embodiments.

In FIG. 2, lines connecting elements show paths through which the elements receives and transmits a signal and/or a potential of power supply and a grand potential.

Figure 4:
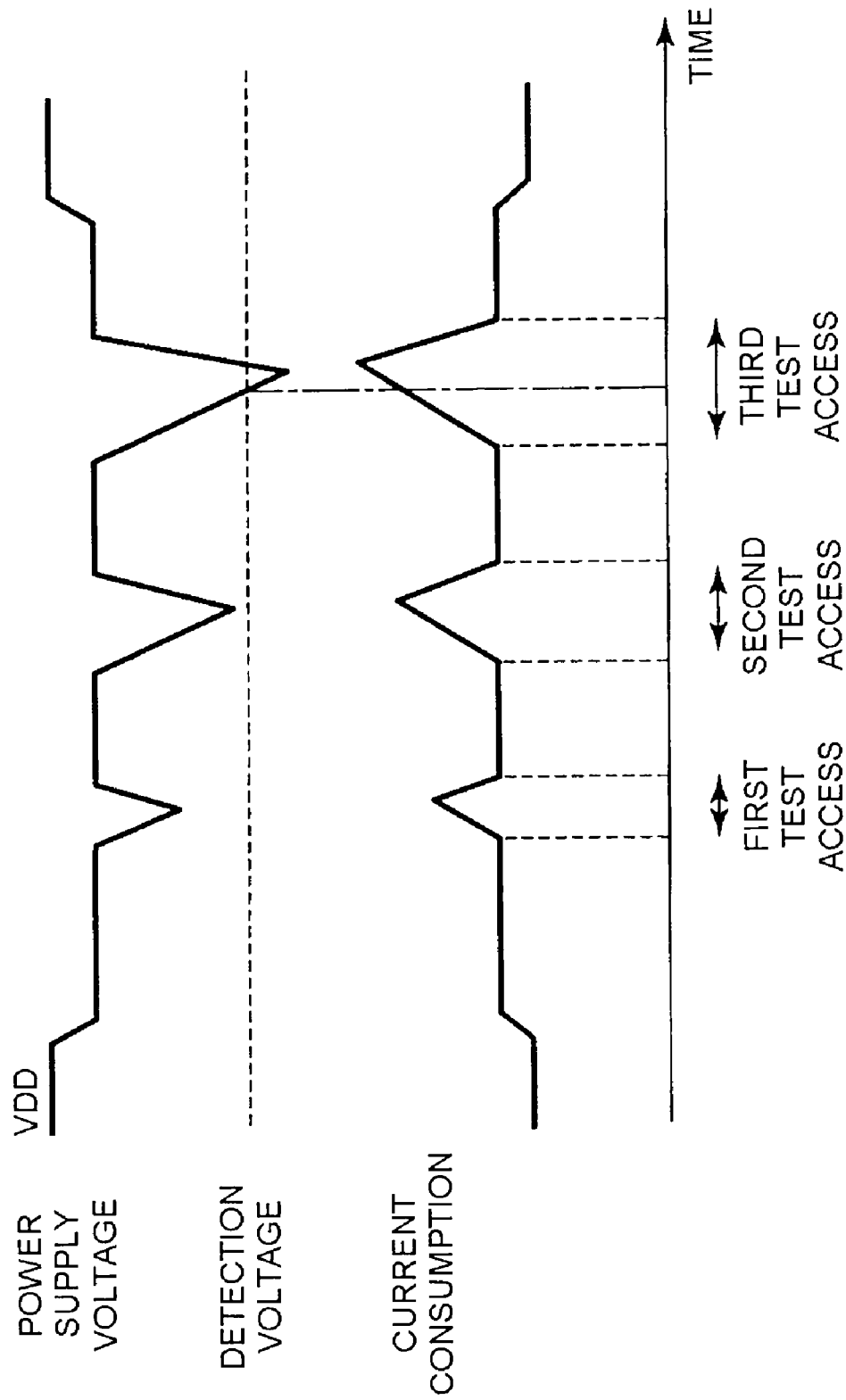
FIG. 4 shows waveforms of current consumption and power supply voltage during test accesses according to the first embodiment.
Figure 5:
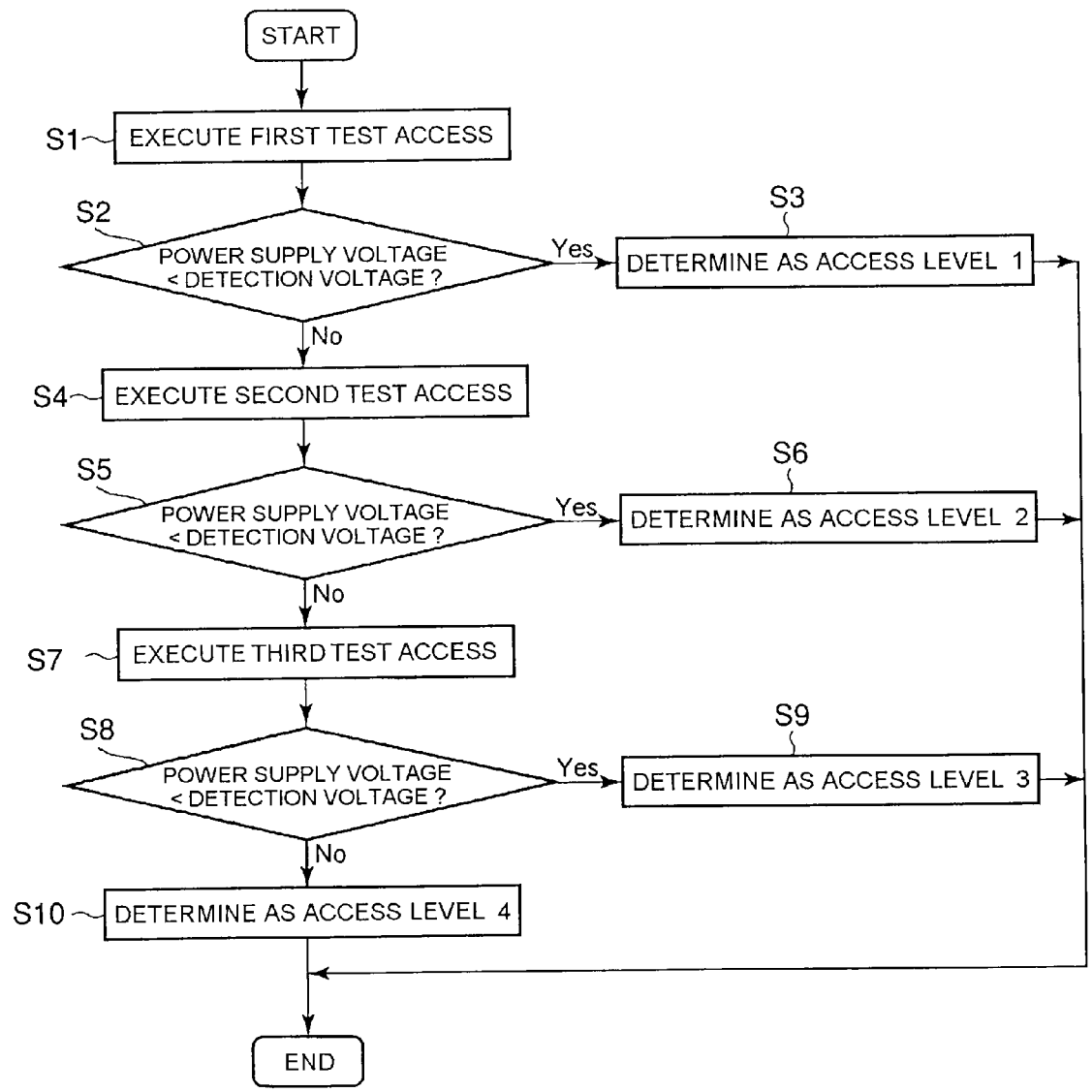
FIG. 5 is a flowchart of the test accesses according to the first embodiment.

Next, referring to FIGS. 4 and 5, operations of the memory card according to the first embodiment will be described. FIG. 4 shows waveforms of current consumption and power supply voltage during test accesses according to the first embodiment. FIG. 5 is a flowchart of the test accesses according to the first embodiment.

Upon start of power supply from the host device 2, the memory card 1 performs an initialization process to switch to a state where the host device 2 can access the memory card 1. After that, during the initialization process (before returning to normal operations), test accesses are executed for determining an access level corresponding to a voltage supply capability of the host device 2.

The MPU 22 determines the access level of current consumption in the memory card 1, with the procedure to be described below, by using the voltage detection circuit 27 according to a program stored in the ROM 24. This access level corresponds to an operating condition of the memory card 1 that does not allow a power supply voltage of the host device 2 to be lowered to or under a value which may cause malfunction of the memory card 1.

As shown in FIGS. 4 and 5, the MPU 22 performs a first test access to be described below, in step S1. In the first test access, the MPU 22 intentionally creates a state where a peak of the current consumption in the memory card 1 is set to a first value. This state is created by actual operations of the card controller 12 and the memory 11. The operating state of the first test access corresponds to, for example, a state where an operation causing the memory card 1 to consume the least current is performed. To be more specific, the operating state of the first test access corresponds to, for example, a state where the MPU 22 performs the single writing processing while operating at the lowest system frequency.

Then, the memory card 1 receives a voltage supplied by the power supply circuit 10 in the operating state of the first test access. The execution of the first test access causes the memory card 1 to consume more current than in a stand-by state. Then, an amount of a current required for the operating condition of the first test access is deducted from an amount of a current supplied from the power supply circuit 10, so that a voltage (a power supply voltage) of the power supply circuit 10 is lowered.

In step S2, the voltage detection circuit 27 compares the power supply voltage in the first test access with a detection voltage which is preset in the voltage detection circuit 27. When the voltage supplied from the power supply circuit 10 after the amount of the current consumed in the operating state of the first test access is deducted falls below the detection voltage, processing proceeds to step S3. In step S3, the voltage detection circuit 27 supplies, to the MPU 22, a signal indicating that the aforementioned supplied voltage falls below the detection voltage. The signal informs the MPU 22 that the current consumed in the operating state of the first access makes the power supply circuit 10 unable to maintain the same level of the detection voltage. The detection voltage can be set to be the lowest value of voltage supplied to the memory card 1 that is necessary to prevent the malfunction of the memory card 1.

Upon being informed that the power supply voltage is made to fall below the detection voltage by the first test access, the MPU 22 determines to operate the memory card 1 at an access level 1. The access level 1 is an operating condition that only requires current consumption smaller than that consumed in the operating state of the first test access. Thereafter, the memory card 1 performs normal operations at the access level 1. Note that an access from the host device 2 whose power supply voltage falls below the detection voltage even in the operating condition of the first test access can be limited to reading out of data.

If the power supply voltage does not fall below the detection voltage in the first test access, a second test access is executed in step S4. In the second test access, the MPU 22 intentionally creates a state where a peak of the current consumption in the memory card 1 is set to a second value. In the operating state of the second test access, a larger current is consumed (larger current peak appears) than in the operation state of the first test access. The operating state of the second test access corresponds to, for example, a state where the MPU 2 performs either or both of the simultaneous reading/writing processing and an operation at a frequency higher than the lowest system frequency. When the memory card 1 receives power supply from the power supply circuit 10 in the operating state of the second test access, the power supply voltage is lowered than that in the first test access.

Next, in step S5, the voltage detection circuit 27 compares the power supply voltage in the second test access with the detection voltage. When the voltage supplied from the power supply circuit 10 after the amount of the current consumed in the operating state of the second test access is deducted falls below the detection voltage, processing proceeds to step S6. In step S6, the voltage detection circuit 27 supplies, to the MPU 22, a signal indicating that the aforementioned supplied voltage falls below the detection voltage. The signal informs the MPU 22 that the current consumed in the operating state of the second test access makes the power supply circuit 10 unable to maintain the detection voltage.

Upon being informed that the power supply voltage is made to fall below the detection voltage by the second test access, the MPU 22 determines to operate the memory card 1 at an access level 2. The access level 2 is an operating condition that only requires current consumption smaller than that consumed in the operating state of the second test access. Specifically, the access level 2 requires a current value equal to or less than that consumed in the operating state of the first test access, for example. Thereafter, the memory card 1 performs normal operations at the access level 2.

If the power supply voltage does not fall below the detection voltage in the second test access, a third test access is executed in step S7. In the third test access, the MPU 22 intentionally creates a state where a peak of the current consumption in the memory card 1 is set to a third value. In the operating state of the third test access, a larger current is consumed than in the second test access. The operating state of the third test access corresponds to, for example, a state where the MPU performs either or both of the simultaneous writing processing and an operation at a frequency higher than the system frequency in the operating state of the second test access. When the memory card 1 receives power supply from the power supply circuit 10 in the operating state of the third test access, the power supply voltage is lowered than that in the second test access.

Next, in step S8, the voltage detection circuit 27 compares the power supply voltage in the third test access with the detection voltage. When the voltage supplied from the power supply circuit 10 after the amount the current consumed in the operating state of the third test access is deducted falls below the detection voltage, processing proceeds to step S9. In step S9, the voltage detection circuit 27 supplies, to the MPU 22, a signal indicating that the aforementioned supplied voltage falls below the detection voltage. The signal informs the MPU 22 that the current consumed in the operating state of the third test access makes the power supply circuit 10 unable to maintain the same level of the detection voltage.

Upon being informed that the power supply voltage is made to fall below the detection voltage by the third test access, the MPU 22 determines to operate the memory card 1 at an access level 3. The access level 3 is an operating condition that only requires current consumption smaller than that consumed in the third test access. Specifically, the access level 3 requires a current value equal to or less than that consumed in the operating state of the second test access, for example. Thereafter, the memory card 1 performs normal operations at the access level 3. Note that FIG. 4 shows an example that the power supply voltage falls below the detection voltage in the third test access.

If the power supply voltage does not fall below the detection voltage in the third test access, the MPU 22 determines to operate the memory card 1 at an access level 4 (the maximum access level), in step S10. The access level 4 is a level allowing any access method.

Three examples of the test accesses are described herein. However, the present invention is not limited to these examples. More detailed operating conditions can be employed. For example, as a requirement for accepting an access at the maximum access level, it may be required that a power supply voltage should not fall below the detection voltage even under the operating condition that the current consumption is the maximum. Such an operating condition corresponds to, for example, the operating condition of using the access method (for example, the simultaneous writing processing) that consumes the maximum current, at the maximum system frequency. In addition, by employing operating states as many as possible, a more optimal access level for the memory 11 can be determined.

In addition, current consumption set in each test access can be adjusted by using various combinations of factors including an access method, a system frequency and the like.

As described above, the card controller 12 creates operating states where the stepwisely increasing values of current consumption are employed, and compares the power supply voltage with the detection voltage in each operating state. After that, while operating, the card controller 12 accesses the memory at the access level requiring only a current consumption that will not decrease the power supply voltage to or below the detection voltage. This optimizes the operation of the card controller 12, and thereby allows the card controller 12 to make the highest-performance access that does not allow the power supply voltage of the host device 2 to fall below the detection voltage.

Furthermore, the present embodiment also has the following effects. There may be a case where characteristics of memories vary therebetween due to variations of manufacturing processes. For this reason, even when the controller 12 makes accesses with the same access method, current consumption varies between the memories 11 or the memory cards 1. Accordingly, even if the memories 11 are manufactured with a goal of receiving power supplies from the same host device 2 and having the same characteristic, they can have different allowable access levels. Furthermore, the degree of decrease in the power supply voltage and the degree of current consumption in the memory card 1 can vary according to a degree of compatibility between the memory card 1 and the host device 2. The present embodiment makes it possible to perform processing to each memory 11 at the optimal access level in consideration of the aforementioned differences.

Figure 6:
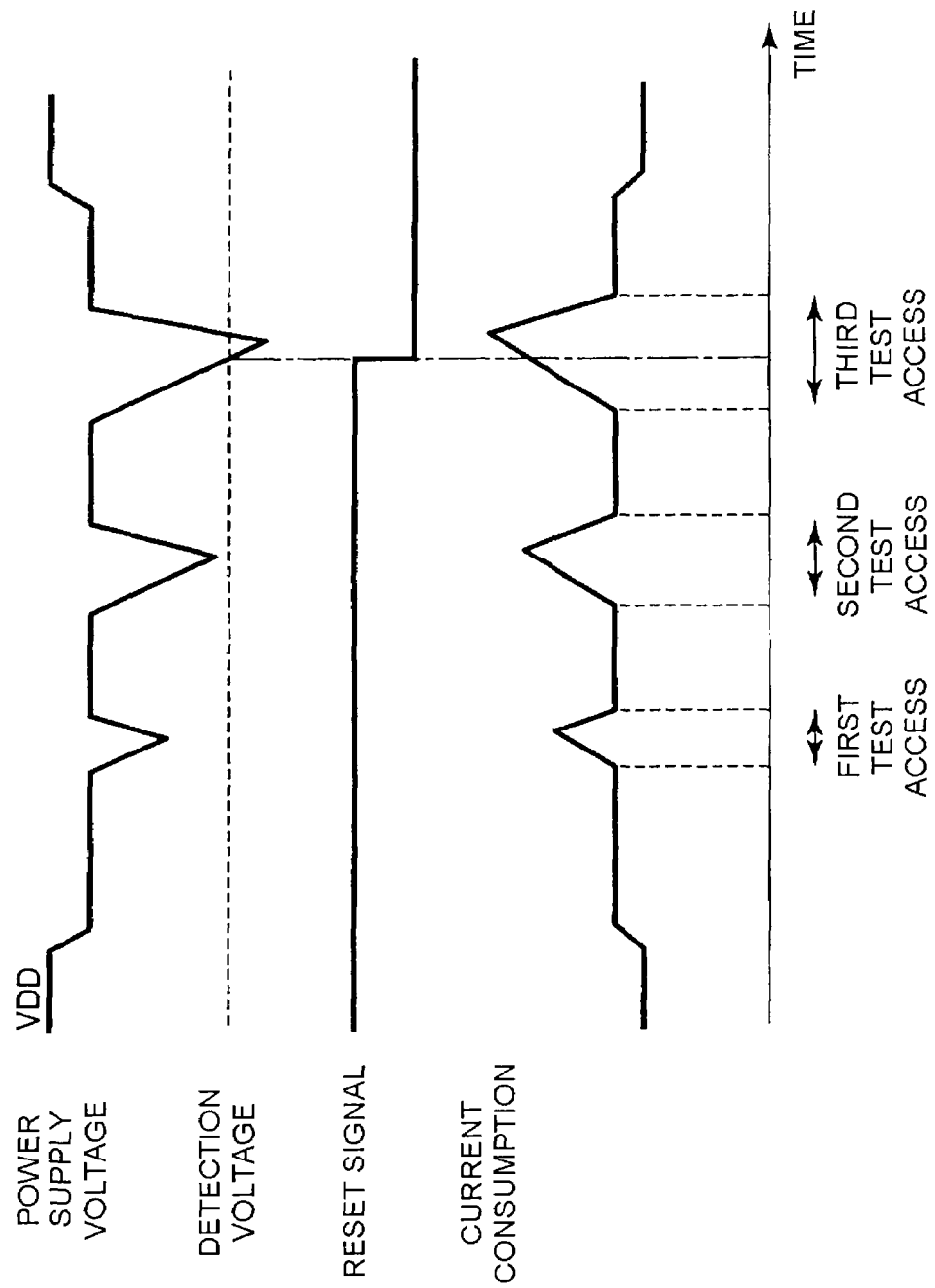
FIG. 6 shows waveforms of current consumption and power supply voltage during the test accesses according to another example of the first embodiment.

As shown in FIG. 6, the card controller 12 can issue a reset signal to the host device 2 when the power supply voltage falls below the detection voltage.

As described above, the memory card according to the first embodiment can determine, at the time of initialization, the access level at which the memory card only consumes a current that does not make the power supply voltage to fall below the detection voltage. This optimizes operations of the memory card 1 and the host device 2 while preventing the power supply voltage from falling below the detection voltage.

In addition, according to the first embodiment, the optimal access level can be obtained in consideration of the variations of the characteristics of the memories 11.

Second Embodiment

A second embodiment is different from the first embodiment in a voltage detection circuit.

A memory card according to the second embodiment has a voltage detection circuit 27B in place of the voltage detection circuit 27 of the first embodiment (FIG. 2). In addition, in the second embodiment, a ROM 24 stores programs different from those in the first embodiment because the memory card of the second embodiment operates differently from that of the first embodiment. This will not be directly described herein, but will be indirectly described through the following description of the operations of the second embodiment.

Figure 7:
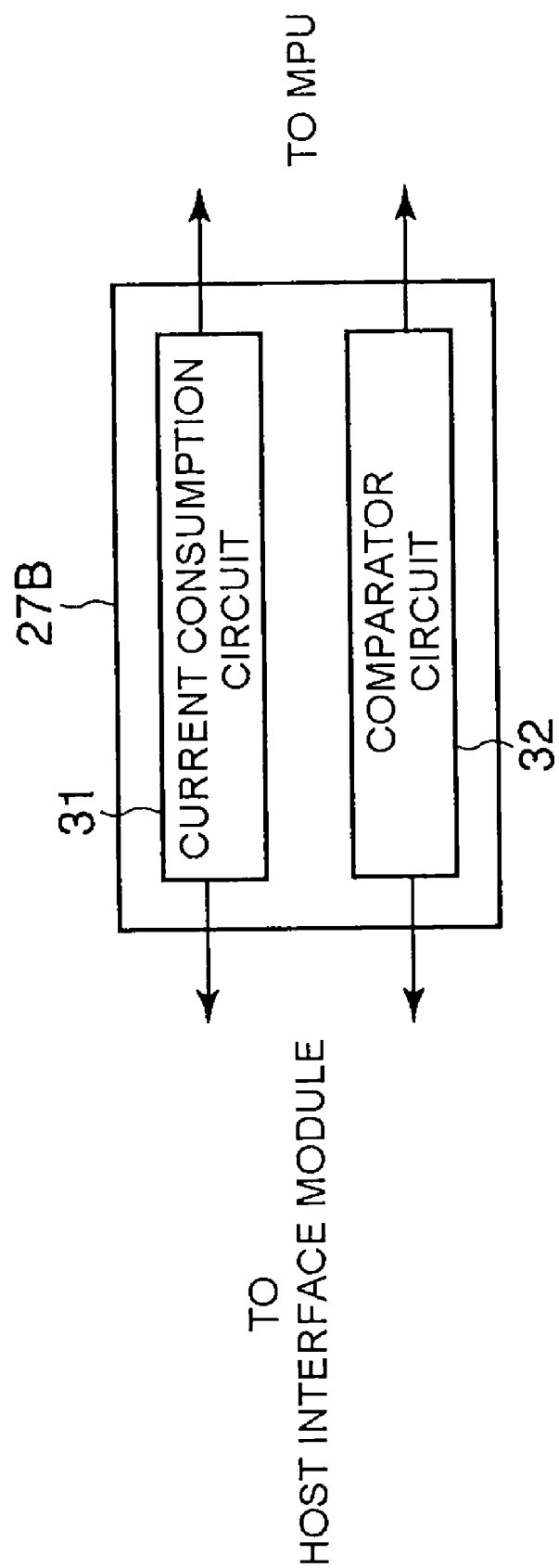
FIG. 7 is a block diagram showing a configuration of a voltage detection circuit according to a second embodiment.

The voltage detection circuit 27B has a configuration shown in FIG. 7. FIG. 7 is a block diagram showing the configuration of the voltage detection circuit 27B according to the second embodiment.

As shown in FIG. 7, the voltage detection circuit 27B includes a current consumption circuit 31 and a comparator circuit 32. As will be described below, the current consumption circuit 31 is configured so as to be capable of consuming currents of different values that are set in advance. For example, which value of current is to be consumed is determined by a MPU 22.

The comparator circuit 32 has the same function as that of the voltage detection circuit 27 according to the first embodiment, and compares a power supply voltage of the host device 2 with a preset detection voltage. Upon detecting that the power supply voltage falls below the detection voltage, the comparator circuit 32 outputs, to the MPU 22, a signal indicating that.

Figure 8:
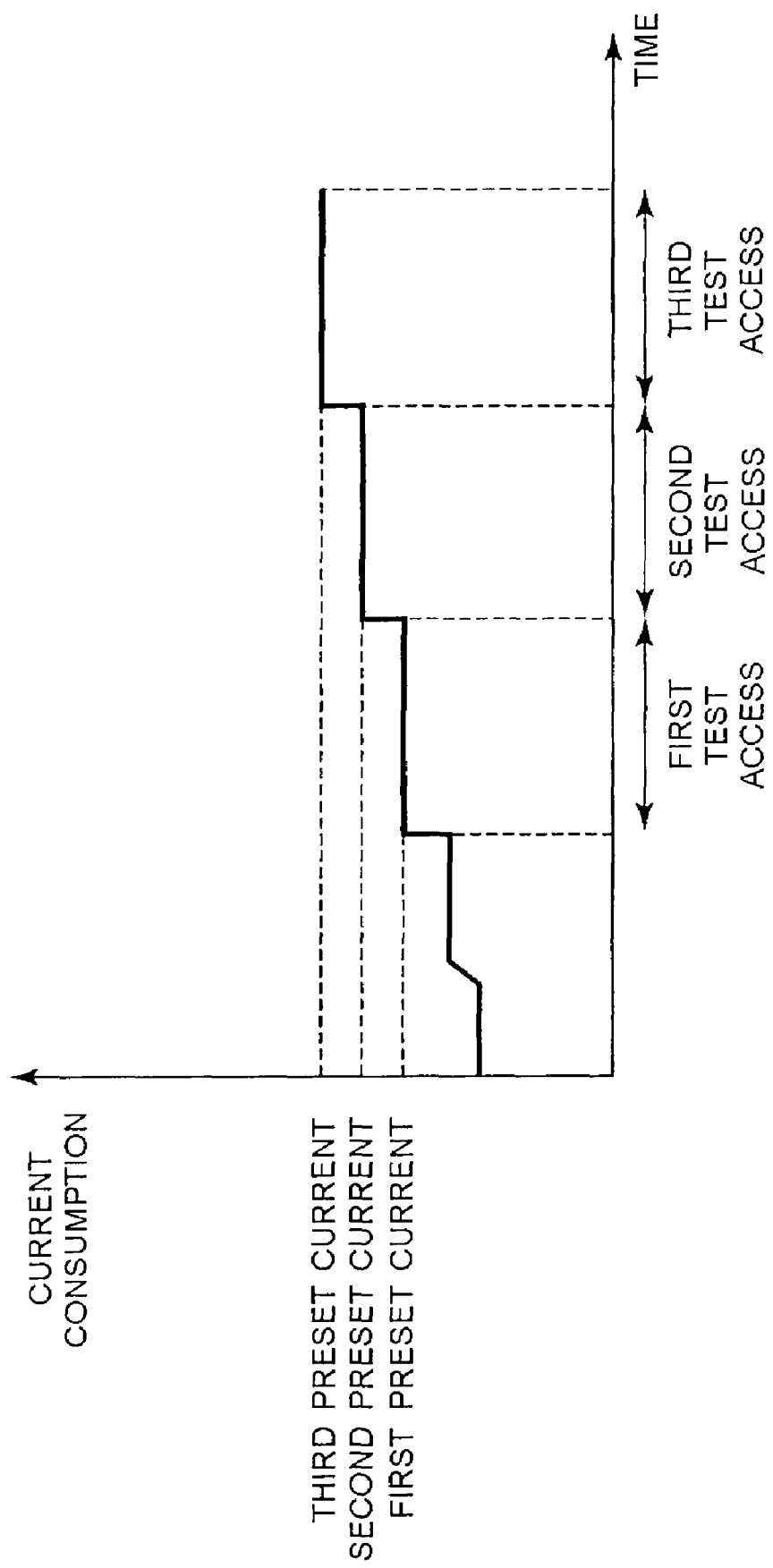
FIG. 8 shows a wave form of current consumption during test accesses according to the second embodiment.

Next, operations of the memory card 1 according to the second embodiment will be described by referring to FIG. 8. FIG. 8 shows a waveform of current consumption during test accesses according to the second embodiment. The MPU 22 determines an access level of the current consumption in the memory card 1, similar to the first embodiment, by use of the voltage detection circuit 27B according to a program stored in the ROM 24. The second embodiment is different from the first embodiment in setting method of the current consumption at the time of the test accesses.

In the second embodiment, as shown in FIG. 8, the MPU 22 controls the current consumption circuit 31 so that the current consumption circuit 31 consumes a current with values stepwisely increasing in test accesses. The preset current values, which are set in the current consumption circuit 31, are determined in consideration of current values estimated to be consumed in the memory card 1 on the basis of various combinations of factors including an access method and/or a system frequency and/or the like. For example, the number of the preset values may be set to eight. In addition, a difference between the preset values may be set to 3 mA.

More specifically, for example, the minimum preset value can be set to be an average value of the current consumption at the time of single writing processing in multiple memory cards and/or at a certain system frequency.

Similarly, the next preset value can be set to be the current consumption value in the operation at a system frequency higher than the lowest system frequency and/or the access method causing the memory card to consume a larger current than during the single writing processing.

The MPU 22 determines an access level by setting a current consumption value at a preset value in each test access. The preset value of the current consumption used in a certain test access is set to higher than that in the previous test access. In this manner, the current consumption is stepwisely increased to determine access levels. A specific method for determining the access levels is same as that of the first embodiment.

In the second embodiment, the preset value of the current consumption is given in advance. Thus, the MPU 22 determines an access level in a shorter time.

In addition, the card controller 12 can issue a reset signal to the host device 2 when the power supply voltage falls below the detection voltage.

As described above, the memory card according to the second embodiment can also determine the access level at which the memory card only consumes a current that does not make the power supply voltage to fall below the detection voltage. Accordingly, effects same as those of the first embodiment can be obtained. Furthermore, according to the second embodiment, the memory card 1 for enabling determination of an access level to be easily and quickly completed can be implemented.

Third Embodiment

A third embodiment is different from the first embodiment in operations of a voltage detection circuit.

A memory card according to the third embodiment has a voltage detection circuit 27C in place of the voltage detection circuit 27 according to the first embodiment (FIG. 2). In addition, in the third embodiment, a ROM 24 stores programs different from those in the first embodiment because the memory card of the third embodiment operates differently from that of the first embodiment. This will not be directly described herein, but will be indirectly described through the following description of the operations of the third embodiment.

Figure 9:
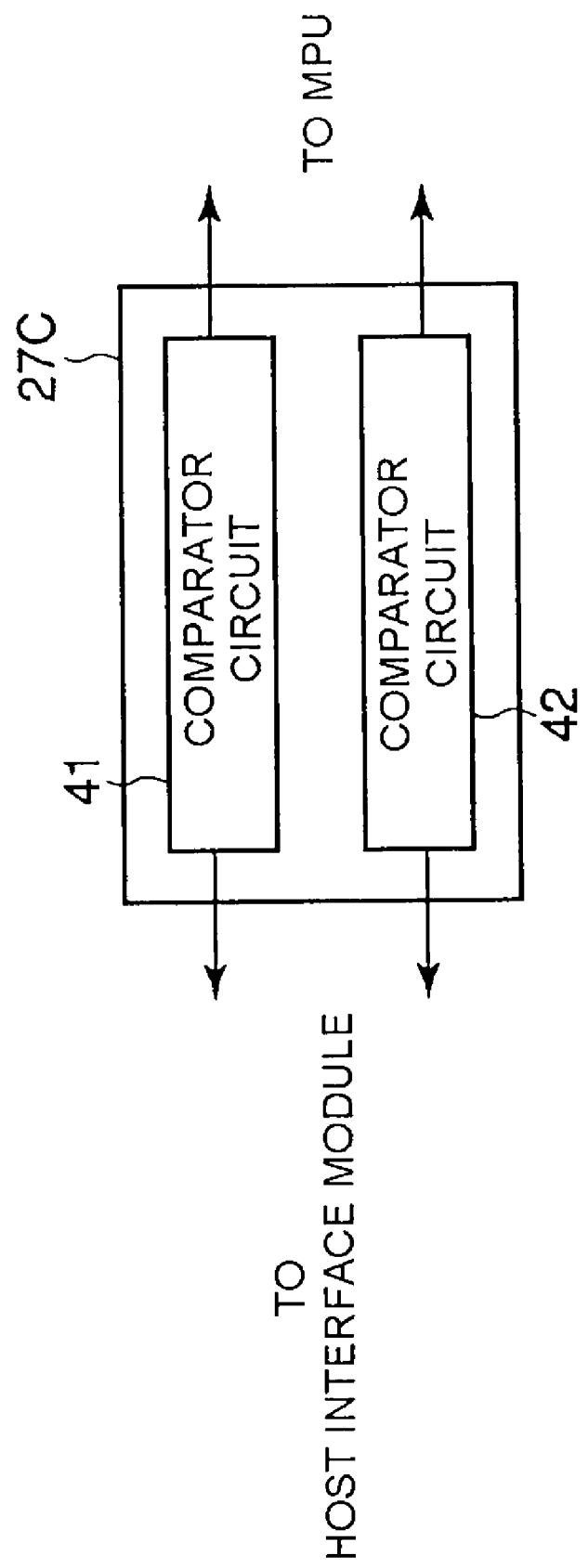
FIG. 9 is a block diagram showing a configuration of a voltage detection circuit according to a third embodiment.

The voltage detection circuit 27C has a configuration shown in FIG. 9. FIG. 9 is a block diagram showing the configuration of the voltage detection circuit 27C according to the third embodiment.

As shown in FIG. 9, the voltage detection circuit 27C has at least comparator circuits 41 and 42. When a power supply voltage of a host device 2 falls below a preset detection voltage, the comparator circuit 41 outputs, to the MPU 22, a signal indicating that. When a power supply voltage of the host device 2 falls below a preset sub-detection voltage, the comparator circuit 42 outputs, to the MPU 22, a signal indicating that. The semi-detection voltage has a value higher than the detection value, and vice versa. In the following description, the case where the semi-detection voltage is higher than the detection voltage is described as an example, but a similar idea is applied to the reverse case.

Figure 10:
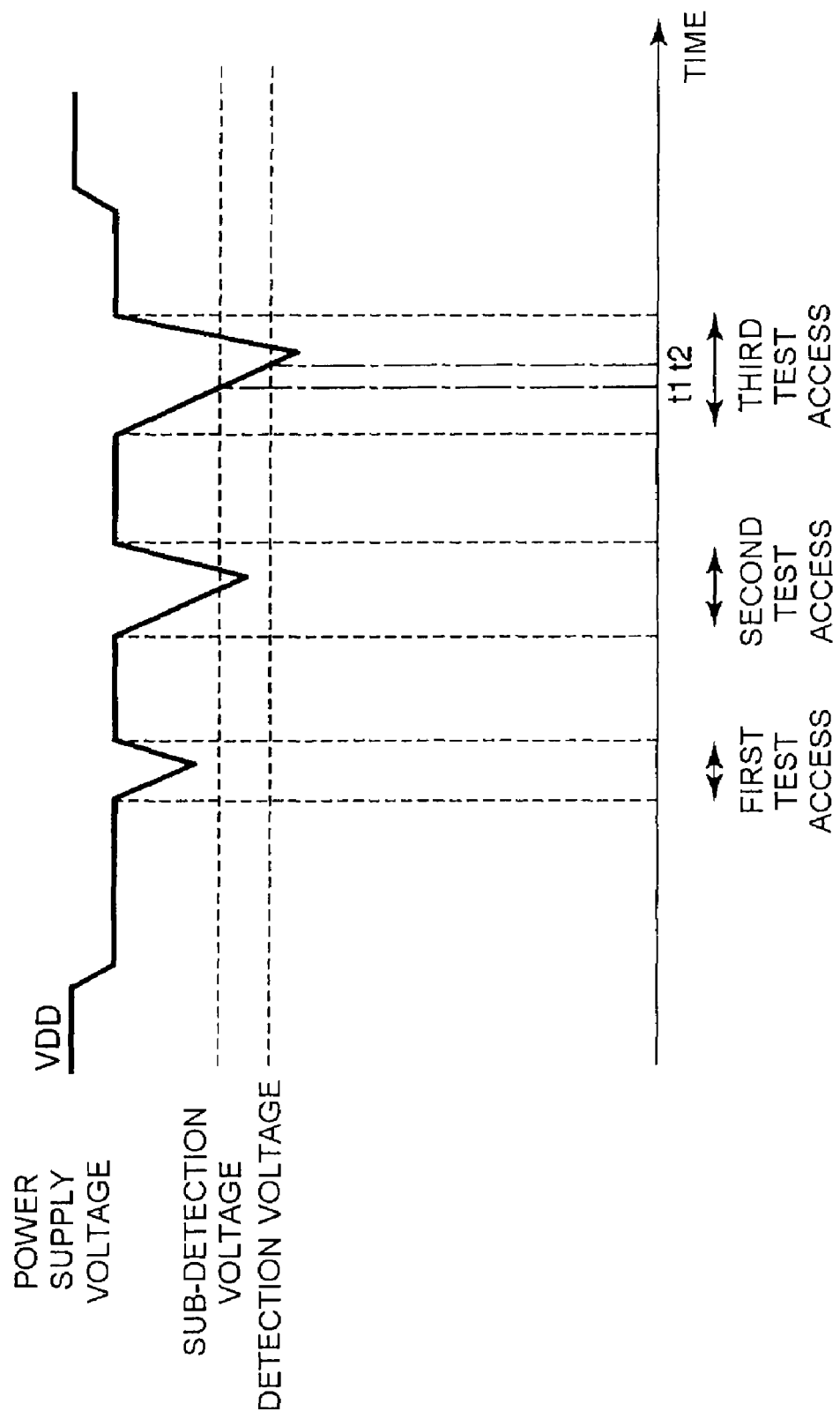
FIG. 10 shows a waveform of power supply voltage during test accesses according to the third embodiment.

Next, operations of the memory card 1 according to the third embodiment will be described by referring to FIG. 10. FIG. 10 shows a waveform of power supply voltage during test accesses according to the third embodiment. The MPU 22 measures a slope of the change in current consumption in the memory card 1 by using the voltage detection circuit 27C according to a program stored in the ROM 24.

Same as the first embodiment, the MPU 22 intentionally creates states where the memory card 1 consumes currents in various operating states (combinations of factors including an access method, a system frequency, and the like). Alternatively, a configuration may be employed in which the voltage detection circuit 27C includes a current consumption circuit 32, which is same as the second embodiment. In this configuration, the current consumption circuit 32 is caused to consume a current through the control by the MPU 22.

The MPU 22 sequentially executes test accesses by the same procedure as that of the first or second embodiment. During each test access, when the power supply voltage of the host device 2 falls below the semi-detection voltage, the comparator circuit 42 supplies, to the MPU 22, a signal indicating that. The MPU 22 measures a time length from a point where the power supply voltage falls below the semi-detection voltage (t1) to an adjacent point where it falls below the detection voltage (t2), by use of, for example, an unillustrated measuring unit. Then, the MPU 22 obtains the slope of the change in the power supply voltage by using the thus-measured time length and the difference between the semi-detection voltage and the detection voltage.

Some types of the host device 2 normally operate even if the power supply voltage falls below a certain reference value in a short time, but malfunction if the power supply voltage falls below the certain reference value in a long time. To address this problem, after detecting that the slope of the change in the power supply voltage of the host device 2 is larger than a predetermined value, the MPU 22 restricts operating conditions in normal operations so that an operating condition of the test access causing the above phenomenon would not be generated in the normal operations.

The MPU can determine an access level by using the same method as that of the first or second embodiment in parallel with the detection of the slope of the change in the power supply voltage. As a reference to determine an access level, the detection voltage set in the comparator circuit 41 may be used.

As described above, the memory card according to the third embodiment can detect the slope of the change in the power supply voltage of the host device 2. This makes it possible to adjust processing in the memory card 1 so as to be performed under an operating condition according to the degree of the slope of the change. In addition, by performing determination of an access level at the same time, the third embodiment can bring effects same as those of the first embodiment.

Fourth Embodiment

A fourth embodiment is different from the first embodiment in operations of a voltage detection circuit.

A configuration of a memory card according to the fourth embodiment is same as that of the third embodiment. In addition, in the fourth embodiment, a ROM 24 stores programs different from those in the third embodiment because the memory card of the fourth embodiment operates differently from that of the third embodiment. This will not be directly described herein, but will be indirectly described through the following description of the operations of the fourth embodiment.

Figure 11:
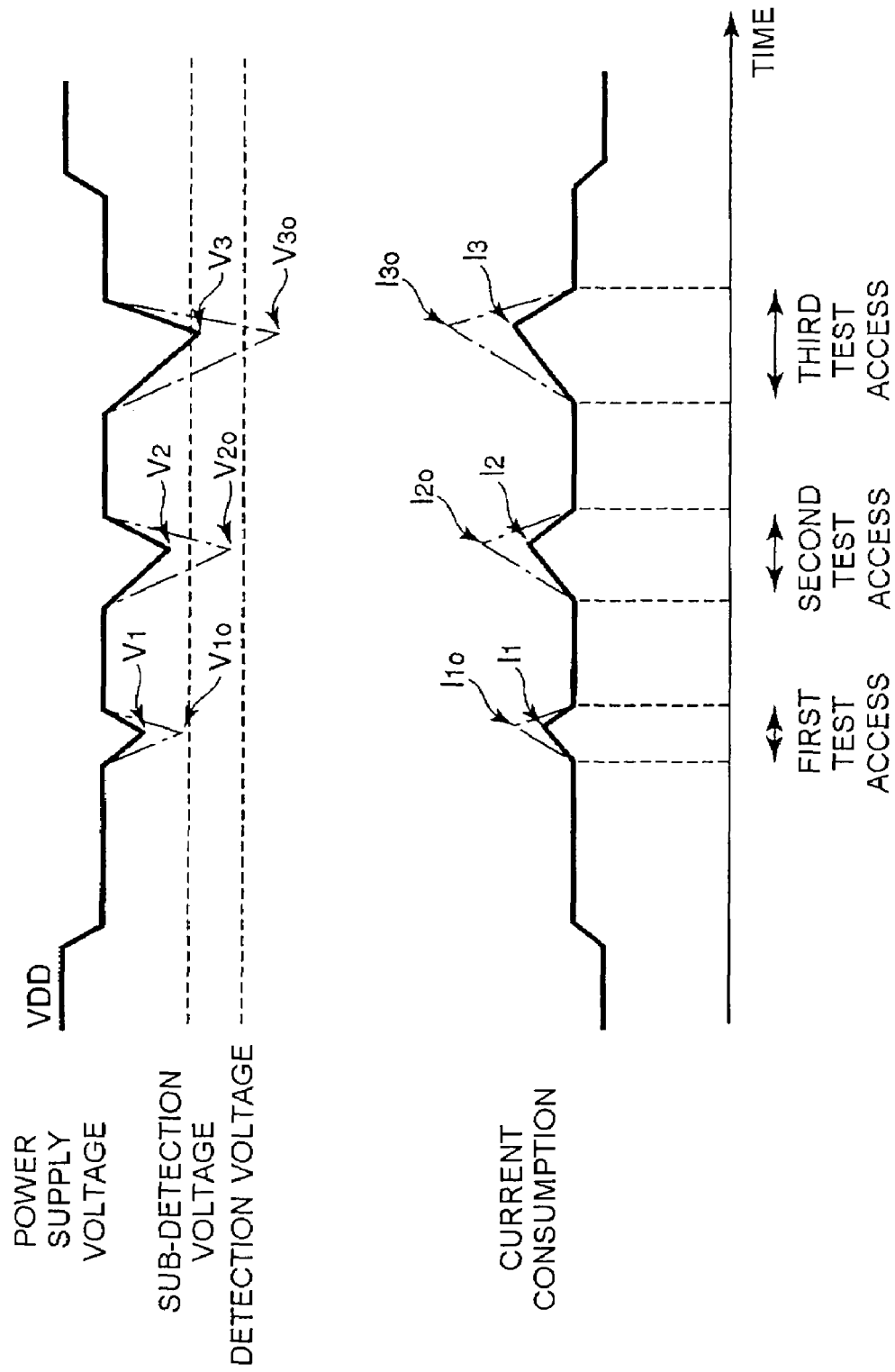
FIG. 11 shows waveforms of current consumption and power supply voltage during test accesses according to a fourth embodiment.

Next, operations of the memory card 1 according to the fourth embodiment will be described by referring to FIG. 11. FIG. 11 shows waveforms of current consumption and power supply voltage during test accesses according to the fourth embodiment. The MPU 22 determines an access level in the memory card 1 by use of the voltage detection circuit 27C according to a program stored in the ROM 24.

As described above, the first and second embodiments can employ a configuration in which the card controller 12 issues a reset signal to the host device 2 when a power supply voltage falls below a detection voltage during the test accesses. However, if a reset signal is actually issued when the power supply voltage falls below the detection voltage during the test accesses, an initialization process is stopped. Thus, this causes a delay before the memory card 1 shifts to normal operations. For this reason, in the test accesses, there is a case where it is preferable that a reset signal be not issued.

The MPU 22 sequentially executes the test accesses by the same procedure as that of the first embodiment. However, in the test access according to the fourth embodiment, a value of current consumption used in each test access is half a value used in the corresponding test access according to the first embodiment. Specifically, current consumption I1 in the first test access is a half of current consumption I1o in the first test access according to the first embodiment. In addition, current consumption I2 in the second test access is a half of current consumption I2o in the second test access according to the first embodiment, and current consumption I3 in the third test access is a half of current consumption I3o used in the third test access according to the first embodiment. The same rule is also applied to the fourth access and the subsequent ones, although not shown.

Since the current consumption in each test access is a half of the current consumption in the corresponding test access according to the first embodiment, the degree of decrease in the power supply voltage in each test access is also smaller in the present embodiment than in the first embodiment. Specifically, the lowest power supply voltage V1 in the first test access is higher than the lowest power supply voltage V1o in the first test access according to the first embodiment. In addition, the lowest power supply voltage V2 in the second test access is higher than the lowest power supply voltage V2o in the second test access according to the first embodiment. Similarly, the lowest power supply voltage V3 in the third test access is higher than the lowest power supply voltage V3o in the third test access according to the first embodiment. The same rule can be also applied to the fourth access and the subsequent ones. In the following description, the first to third test accesses will be used as a representative example.

Then, in consideration of a relationship between a degree of decrease in the current consumption and a power supply voltage, a semi-detection voltage is determined to meet the following condition. When any one of power supply voltages V1o, V2o, and V3o (for example, V3o) falls below a detection voltage, the corresponding power supply voltage V1, V2, or V3 (for example, V3) should fall below the semi-detection voltage. Specifically, in the example of FIG. 11, it is regarded to be detected that the power supply voltage V3o is made to fall below the detection voltage by the current consumption I3o without actually applying the current consumption I3o having double the value of the current consumption I3. In fact, such a detection is achieved by detecting that the power supply voltage V3 influenced by the current consumption I3 falls below the semi-detection voltage. The semi-detection voltage is set to a value enabling such detection.

If a power supply voltage falls below the semi-detection voltage during a certain test access (for example, the third test access), it is anticipated that the power supply voltage will be made to fall below the detection voltage by current consumption having double the value of the current consumption in this test access. Thus, the memory card 1 only performs an operation which requires current consumption having double the value of current consumption equal to or below that in the second test access, in normal operations.

By employing a method for determining an access level as described above, even in a configuration in which a reset signal is issued when the power supply voltage falls below the detection voltage, an access level can be determined without issuing the reset signal during the test accesses.

There is described the example that a value of current consumption used in each test access is half the value used in the corresponding test access according to the first embodiment. That is, there is described the example that current consumption in each of the first to n-th test accesses according to the first embodiment has double a value of current consumption in the corresponding one of the first to n-th test accesses according to the fourth embodiment. However, a different proportion may be employed. Specifically, it is only needed that each value of current consumption in each of the first to n-th test accesses according to the first embodiment be equal to a value obtained by multiplying the value of current consumption in the corresponding one of the first to n-th test accesses according to the fourth embodiment by a common value larger than 1.

As described above, the memory card according to the fourth embodiment can also determine the access level at which the memory card only consumes a current that does not make the power supply voltage to fall below the detection voltage. Thus, the same effects as those of the first embodiment can be obtained.

In addition, according to the fourth embodiment, an access level can be determined before a reset signal is issued, even if the memory card 1 is configured so as to issue the reset signal when the power supply voltage falls below the detection voltage.

From the foregoing description, those skilled in the art can ascertain various changes and modifications without departing from the spirit and scope thereof, and it is understood that these changes and modifications are also included within the scope of claims.

What is claimed is:

1. A memory system receiving a power supply from a host device comprising:
   a non-volatile semiconductor memory; and
   a controller for controlling writing and reading data to and from the semiconductor memory, in response to a request from the host device,
   wherein the controller operates in such a manner that an amount of each of n currents is deducted from an amount of a current supplied from the power supply, the n currents having n values that gradually increase from the first to n-th (n is a natural number equal to or larger than 2);
   when an amount of each of the n currents is deducted from an amount of a current supplied from the power supply in order from the first to n-th values, the controller determines whether or not the corresponding voltage of the power supply falls below a preset detection voltage; and
   after detecting that a current having the p-th (p is a natural number between 2 and n, inclusive) one of the n values makes the corresponding voltage of the power supply to fall below the detection voltage, the controller operates so that the memory system consumes a current having a value smaller than the p-th one of the n values.

2. The memory system according to claim 1, wherein the n values are generated by creating states where the memory system consumes currents each corresponding to an operation thereof.

3. The memory system according to claim 1, further comprising a current consumption circuit,
   wherein the n values are set in advance, and are generated by the current consumption circuit.

4. The memory system according to claim 1, further comprising a determination circuit for determining whether or not a voltage of the power supply falls below a semi-detection voltage higher than the detection voltage,
   wherein the controller has a function to measure a slope of a change in the voltage of the power supply, while an amount of one of the currents having the n values is deducted from an amount of a current supplied from the power supply, by using both a difference between the detection voltage and the semi-detection voltage, and a time length between a point where the voltage of the power supply falls below the semi-detection voltage and a point where it falls below the detection voltage.

5. The memory system according to claim 1, wherein after detecting that a current having the p-th one of the n values makes the corresponding voltage of the power supply to fall below the detection voltage, the controller issue a reset signal to the host device.

6. The memory system according to claim 1, wherein the memory system operates so as to consume a current having a value equal to or smaller than the (p−1)-th value is achieved by selecting what combination of processes to perform in parallel and by changing an operating frequency of the controller, the processes to be combined including: wiring data in the semiconductor memory, reading data from the semiconductor memory, erasing data from the semiconductor memory, and the controller's preparing an instruction of writing data to the semiconductor memory.

7. The memory system according to claim 1, wherein the memory system operates so as to consume a current having a value equal to or smaller than the (p−1)-th value is achieved by single writing processing while operating the controller at the lowest frequency.

8. The memory system according to claim 7, wherein the memory system operates so as to consume a current having a value equal to the p-th value is achieved by either or both of simultaneous reading/writing processing and operating the controller at a frequency higher than the lowest system frequency.

9. The memory system according to claim 8, wherein the memory system operates so as to consume a current having a value equal to the (p+1)-th value is achieved by either or both of simultaneous writing processing and operating the controller at a frequency higher than the system frequency in the operating state where the memory system operates so as to consume a current having a value equal to the p-th value.

10. A memory system receiving a power supply from a host device comprising:
   a non-volatile semiconductor memory; and
   a controller for controlling writing and reading data to and from the semiconductor memory, in response to a request from the host device,
   wherein the controller operates in such a manner that an amount of each of n currents is deducted from an amount of a current supplied from the power supply, the n currents having n values gradually increasing from the first to n-th (n is a natural number equal to or larger than 2);
   when an amount of each of the n currents is deducted from an amount of a current supplied from the power supply in order from the first to n-th values, the controller determines whether or not the corresponding voltage of the power supply falls below a preset detection voltage; and
   after detecting that a current having the p-th (p is a natural number between 2 and n, inclusive) one of the n values makes the corresponding voltage of the power supply to fall below the detection voltage, the controller operates so that the memory system consumes a current having a value obtained by multiplying a value smaller than the p-th one of the n values by a common value larger than 1.

11. The memory system according to claim 10, wherein the n values are generated by creating states where the memory system consumes currents each corresponding to an operation thereof.

12. The memory system according to claim 10, further comprising a current consumption circuit,
   wherein the n values are set in advance, and are generated by the current consumption circuit.

13. The memory system according to claim 10, wherein after detecting that a current having the p-th one of the n values makes the corresponding voltage of the power supply to fall below the detection voltage, the controller issue a reset signal to the host device.

14. The memory system according to claim 10, wherein the memory system operates so as to consume a current having a value equal to or smaller than the (p−1)-th value is achieved by selecting what combination of processes to perform in parallel and by changing an operating frequency of the controller, the processes to be combined including: wiring data in the semiconductor memory, reading data from the semiconductor memory, erasing data from the semiconductor memory, and the controller's preparing an instruction of writing data to the semiconductor memory.

15. A method of controlling a memory system, the memory system including a non-volatile semiconductor memory and a controller for controlling writing and reading data to and from the semiconductor memory, in response to request from the host device, comprising:
   deducting an amount of each of n currents from an amount of a current supplied from the power supply, the n currents having n values that gradually increase from the first to n-th (n is a natural number equal to or larger than 2);
   determining whether or not the corresponding voltage of the power supply falls below a preset detection voltage when an amount of each of the n currents is deducted from an amount of a current supplied from the power supply in order from the first to n-th values; and
   operating so that the memory system consumes a current having a value smaller than the p-th one of the n values after detecting that a current having the p-th (p is a natural number between 2 and n, inclusive) one of the n values makes the corresponding voltage of the power supply to fall below the detection voltage.

16. The method according to claim 15, further comprising:
   generating the n values by creating states where the memory system consumes currents each corresponding to an operation thereof.

17. The method according to claim 15, wherein the n values are set in advance.

18. The method according to claim 15, further comprising:
   determining whether or not a voltage of the power supply falls below a semi-detection voltage higher than the detection voltage, and
   measuring a slope of a change in the voltage of the power supply, while an amount of one of the currents having the n values is deducted from an amount of a current supplied from the power supply, by using both a difference between the detection voltage and the semi-detection voltage, and a time length between a point where the voltage of the power supply falls below the semi-detection voltage and a point where it falls below the detection voltage.

19. The method according to claim 15, further comprising:
   issuing a reset signal to the host device after detecting that a current having the p-th one of the n values makes the corresponding voltage of the power supply to fall below the detection voltage.

20. The method according to claim 15, further comprising:
   selecting what combination of processes to perform in parallel and changing an operating frequency of the controller so as to consume a current having a value equal to or smaller than the (p−1)-th value,
   wherein the processes to be combined including: wiring data in the semiconductor memory, reading data from the semiconductor memory, erasing data from the semiconductor memory, and the controller's preparing an instruction of writing data to the semiconductor memory.

* * * * *